(12) United States Patent
Iyer

(10) Patent No.: US 6,262,675 B1
(45) Date of Patent: Jul. 17, 2001

(54) METHOD OF COMPRESSING DATA WITH AN ALPHABET

(75) Inventor: Balakrishna Raghavendra Iyer, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/471,102

(22) Filed: Dec. 21, 1999

(51) Int. Cl.[7] .................................................. H03M 7/34
(52) U.S. Cl. ................................................ 341/51; 341/87
(58) Field of Search .................... 341/51, 95, 65, 341/63, 106, 79, 87

(56) References Cited

U.S. PATENT DOCUMENTS

| | | | |
|---|---|---|---|
| 4,748,638 | * 5/1988 | Friedman et al. | 341/51 |
| 4,814,746 | 3/1989 | Miller et al. | 341/95 |
| 4,876,541 | * 10/1989 | Storer | 341/51 |
| 5,406,279 | 4/1995 | Anderson et al. | 341/51 |
| 5,412,384 | 5/1995 | Change et al. | 341/51 |
| 5,424,732 | * 6/1995 | Iyer et al. | 341/51 |
| 5,448,733 | 9/1995 | Satoh et al. | 341/79 |
| 5,455,576 | * 10/1995 | Clark, II et al. | 341/50 |
| 5,521,597 | 5/1996 | Dimitri | 341/51 |
| 5,532,693 | 7/1996 | Winters et al. | 341/51 |
| 5,561,421 | 10/1996 | Smith et al. | 341/51 |
| 5,572,206 | * 11/1996 | Miller et al. | 341/51 |
| 5,608,396 | 3/1997 | Cheng et al. | 341/50 |
| 5,694,125 | 12/1997 | Owsley et al. | 341/50 |

OTHER PUBLICATIONS

Wan et al. (1994) IEEE International Conference on Neural Networks, pp. 4384–4389.

* cited by examiner

Primary Examiner—Howard L. Williams
Assistant Examiner—Jean Bruner JeanGlaude
(74) Attorney, Agent, or Firm—Gates & Cooper LLP

(57) ABSTRACT

An improved LZ77 data compression and decompression method, known as Le'Z99, uses an embedded alphabet to optimize code space and speed in the compressed data.

6 Claims, 3 Drawing Sheets

METHOD OF COMPRESSING DATA WITH AN ALPHABET

BACKGROUND OF THE INVENTION

1. Field of the Invention

This invention relates in general to data compression, and in particular, to a method for compressing and decompressing data with an alphabet.

2. Description of Related Art

The Liv-Zempel 77 (LZ77) method is a well known method of data compression and decompression. However, it is inefficient in terms of its code space usage. This can be illustrated by an encoding and decoding example using the prior art LZ77 algorithm.

The following terms are used in describing the prior art LZ77 method:

Input Stream: a sequence of characters to be compressed;

Character: a basic data element in the input stream;

Coding Position: a position of the character in the input stream that is currently being coded (the beginning of a lookahead buffer defined below);

Lookahead Buffer: a character sequence from the coding position to an end of the input stream;

Window: a "backward" window of size W that contains W characters from the coding position, i.e., the last W characters previously processed;

Pointer: a pointer to a match in the window W that also specifies the length of the match.

With regard to encoding, the prior art LZ77 method searches the window for the longest match with the beginning of the lookahead buffer and outputs a pointer to that match. Since it is possible that not even a one-character match can be found, the output cannot contain just pointers. The prior art LZ77 method solves this problem as follows: after each pointer, it outputs the first character in the lookahead buffer after the match; if there is no match, then it outputs a null-pointer and the character at the coding position. Then, the coding position is moved further by one.

Specifically, the steps of the prior art LZ77 encoding method comprise the following:

(i) Set the coding position to the beginning of the input stream.

(ii) Find a match in the backward window W for the lookahead buffer.

(iii) output the triple (B,L)C with the following meanings:
  (1) B is the number of characters to be traversed backwards in the backward window W in order to get to the starting location of the match. If there is no match, then B takes a null value (0) without loss of generality.
  (2) L is the number of characters matched.
  (3) C is the first character in the lookahead buffer that did not match.

(iv) If the lookahead buffer is not empty, then move the coding position (and the backward window W) L+1 characters forward and return to step (ii); otherwise, terminate.

This is best illustrated by providing an example of the prior art LZ77 encoding method. The following table describes the input data for the example, wherein the first row indicates the position and the second row indicates the corresponding character:

| Pos  | 1 | 2 | 3 | 4 | 5 | 6 | 7 | 8 | 9 |
|------|---|---|---|---|---|---|---|---|---|
| Char | A | A | B | C | B | B | A | B | C |

The following table illustrates the prior art LZ77 encoding method performed on the above input data:

| Step | Pos | W       | Match | Char | Output  |
|------|-----|---------|-------|------|---------|
| 1.   | 1   | —       | —     | A    | (0,0) A |
| 2.   | 2   | A       | A     | B    | (1,1) B |
| 3.   | 4   | AAB     | —     | C    | (0,0) C |
| 4.   | 5   | AABC    | B     | B    | (2,1) B |
| 5.   | 7   | AABCBB  | AB    | C    | (5,2) C |

The following describes the columns in the above table:

The column Step indicates the number of the encoding step. It completes each time the prior art LZ77 encoding method makes an output. With the prior art LZ77 method, this happens in each step of the encoding method above at (iii).

The column Pos indicates the coding position. The first character in the input stream has the coding position 1.

The column W shows the backward window.

The column Match shows the longest match found in the window.

The column Char shows the first character in the lookahead buffer after the match.

The column Output presents the output in the format (B,L)C. (B,L) is the pointer to the Match, which provides the following instruction to the decoding method: "Go back B characters in the window and copy L characters to the output." C is the next character.

With regard to the prior art LZ77 decoding method, the window is maintained the same way as during the encoding method. In each step, the decoding method reads a triple (B,L)C from the input. The decoding method outputs the sequence from the window specified by (B,L) and the character C.

The compression ratio achieved by the prior art LZ77 method is very good for many types of data, but the encoding method can be quite time-consuming, since there are a lot of comparisons to perform between the lookahead buffer and the window. On the other hand, the decoding method is very simple and fast. Memory requirements are low both for the encoding and the decoding methods, since the only structure held in memory is the window, which is usually sized between 4 and 1 kilobyte.

However, the prior art LZ77 method suffers from the problem of non-optimal code space usage, because it uses two integers and one character for a code. The first integer is the starting position of the match, the second integer is the length of the match, and the character is the first non-matching character after the match. In practical terms, including the first non-matching character after the match leads to compression inefficiency.

Other prior art methods exist to code this character selectively, based on an efficiency criteria. However, each requires that the decoding method check whether it is to decode a character of a string from the window. In logic or instruction terms, the check requires a conditional branch, once for every compressed code, resulting in inefficient logic. For systems that are read intensive (such as database management systems where reads outnumber writes by 3-to-1 or more), it is necessary to speed up the decoding method, and removing conditional branches from the decoding method is one means of doing so. Thus, there is a need in the art for an improved LZ77 method that not only optimizes code space usage, but also the speed of decoding.

SUMMARY OF THE INVENTION

To overcome the limitations in the prior art described above, and to overcome other limitations that will become apparent upon reading and understanding the present specification, the present invention discloses a method, apparatus, and article of manufacture for compressing and decompressing data using an embedded alphabet to reduce code space in the compressed data.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to die accompanying drawings which form a part hereof, and in which is shown by way of illustration a specific embodiment in which the invention may be practiced. It is to be understood that other embodiments may be utilized and structural and functional changes may be made without departing from the scope of the present invention.

OVERVIEW

The present invention describes an improved LZ77 method of data compression and decompression that optimizes code space usage. Throughout this specification, the improved LZ77 method is referred to as "the Le'Z99 method."

HARDWARE AND SOFTWARE ENVIRONMENT

Figure 1:
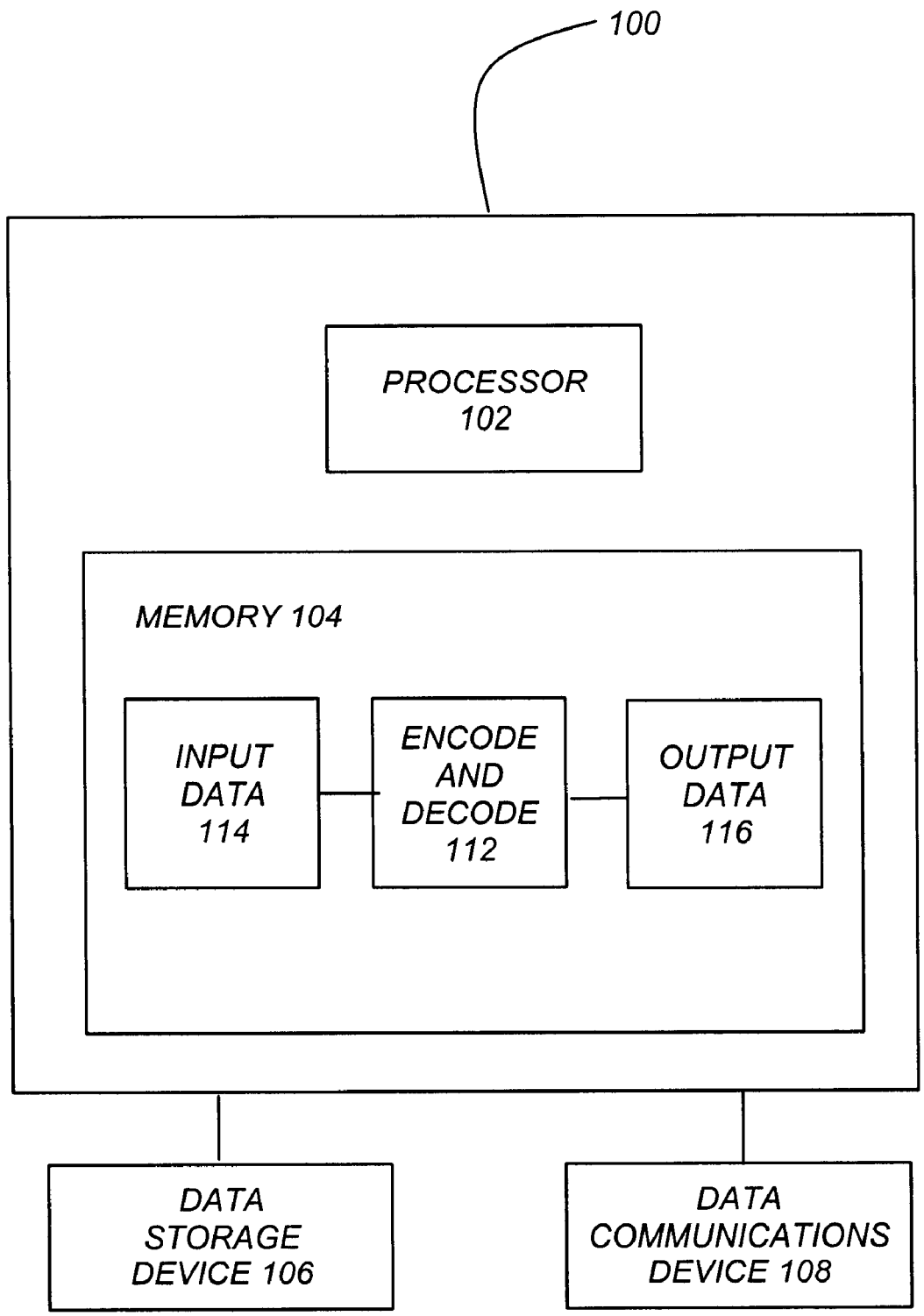
FIG. 1 illustrates the hardware and software environment of the present invention.

FIG. 1 illustrates an exemplary hardware and software environment that could be used with the preferred embodiment of the present invention. In the exemplary environment, the present invention is typically implemented using a computer 100, which may include, inter alia, a processor 102, random access memory (RMA 104, data storage devices 106 (e.g., hard, floppy, and/or CD-ROM disk drives, etc.), data communications devices 108 (e.g., modems, network interfaces, etc.), etc. Of course, those skilled in the art will recognize that the present invention may be implemented in any number of other devices, without departing from the scope of the present invention.

In the preferred embodiment, the present invention is usually implemented in one or more computer programs 110 that comprises an encode and decode program, although different programs could be used to provide each of these functions. The encode and decode program 110 accepts input data 112 and generates output data 114, the contents of which depend upon whether the encode and decode program 110 is performing an encode method or a decode method.

Generally, the encode and decode program 110, input data 112, and output data 114 each comprises logic and/or data that is embodied in or retrievable from a device, medium, or carrier, e.g., a fixed or removable data storage device, a remote device coupled to the computer by a data communications device, etc. Moreover, this logic and/or data, when read, executed, and/or interpreted by the computer 100, cause the computer 100 to perform the steps necessary to implement and/or use the present invention.

Thus, the present invention may be implemented as a method, apparatus, or article of manufacture using standard programming and/or engineering techniques to produce software, firmware, hardware, or any combination thereof. The term "article of manufacture", or alternatively, "computer program carrier", as used herein is intended to encompass logic or instructions accessible from any computer-readable device, carrier, or media.

Of course, those skilled in the art will recognize many modifications may be made to this configuration without departing from the scope of the present invention. For example, those skilled in the art will recognize that any number of devices and/or programs may be used to implement the present invention, so long as similar functions are performed thereby.

OPERATION OF THE ENCODE AND DECODE PROGRAM

The encode and decode program 112 solves the problem of efficiency and speed by providing an Le'Z99 method with an embedded alphabet. In this method, an immutable, ordered list or window A of the alphabet is attached to a backward window W.

For example, let A be a window comprising the entire alphabet. W, as in the prior art LZ77 method, is still the backward window. However, the Le'Z99 method encodes the input data 112, not based on the backward window W, but based on a coding window CW, which is a concatenation of the backward window W (which need not be a fixed size) and the alphabet window A (which generally is a fixed size). Since the alphabet window A includes all the symbols in the alphabet, every character and thus every phrase in the input data 112 will be matched.

The Le'Z99 encoding method is described below:
  (i) set the coding position to the beginning of the input data 112;
  (ii) find a match in the coding window CW for the lookahead buffer (for example, the longest match);
  (iii) output the pair (B,L) with the following meaning:
    (1) B is the number of characters traversed backward in the coding window CW in order to get to the starting location of the match;
    (2) L is the number of characters matched;
  (iv) if the lookahead buffer is not empty, then move the coding position (and the backward window W) L characters forward and return to (ii); otherwise, terminate.

To compare the Le'Z99 method with the prior art LZ77 method described above, an example is provided. It can be seen that steps (iii) and (iii)(3) of the prior art LZ77 method have been modified and deleted, respectively. Also, note that step (ii) matches the lookahead buffer with the coding window CW in the Le'Z99 method, instead of just the backward window W as in the prior art LZ77 method.

This is best illustrated by providing an example of the Le'Z99 encoding method. The following table describes the input data 112 for the example, wherein the first row indicates the position and the second row indicates the corresponding character:

| Pos  | 1 | 2 | 3 | 4 | 5 | 6 | 7 | 8 | 9 | 10 |
|------|---|---|---|---|---|---|---|---|---|----|
| Char | A | A | B | C | B | B | A | B | C | —  |

The following table illustrates the Le'Z99 encoding method performed on the above input data 112:

| Step | Pos | W    | CW      | Match | Code Output |
|------|-----|------|---------|-------|-------------|
| 1.   | 1   | —    | ABC     | A     | (3,1)       |
| 2.   | 2   | A    | AABC    | ABC   | (3,3)       |
| 3.   | 5   | AABC | AABCABC | B     | (2,1)       |
| 4.   | 6   | AABCB| AABCBABC| BABC  | (4,4)       |

The following describes the columns in the above table:

The column Step indicates the number of the encoding step. Each encoding step makes an output. As in the prior art LZ77 method, so too for the Le'Z99 method, this occurs at line (iii) of the encoding method above.

The column Pos indicates the coding position. The first character in the input has the coding position 1.

The column W stores the contents of the backward window.

The column CW stores the contents of the coding window.

The column Match shows the longest match found in the coding window CW.

The column Output presents the output in the format (B,L). (B,L) is the pointer to the Match. This gives the following instruction to the decoding method: "Go back B characters in the coding window CW and copy L characters to the output", wherein B represents the displacement and L represents the length (in this embodiment, B>=1 and L>=1, although other embodiments could use a different base or coding scheme). The Le'Z99 method is assured of a match of at least length one; the prior art LZ77 method cannot be so assured.

For this example, the Le'Z99 method uses the same number of codes to compress the string "AABCBBAC" as the prior art LZ77 method. However, the Le'Z99 codes do not contain the extra character contained in every LZ77 code. For this example, therefore, the Le'Z99 method provides more compression than the prior art LZ77 method. In addition, realization of the Le'Z99 method in software and/or hardware is easier due to the simplification of the logic.

With regard to decoding in the Le'Z99 method, the coding window CW and backward window W are maintained in the same way as with the encoding method. In each step, the Le'Z99 method reads a pair of integers (B,L) from the input data 112. The Le'Z99 method then outputs a sequence from the coding window CW as specified by (B,L) to the output data 114.

LOGIC OF THE Le'Z99 ENCODING METHOD

Figure 2:
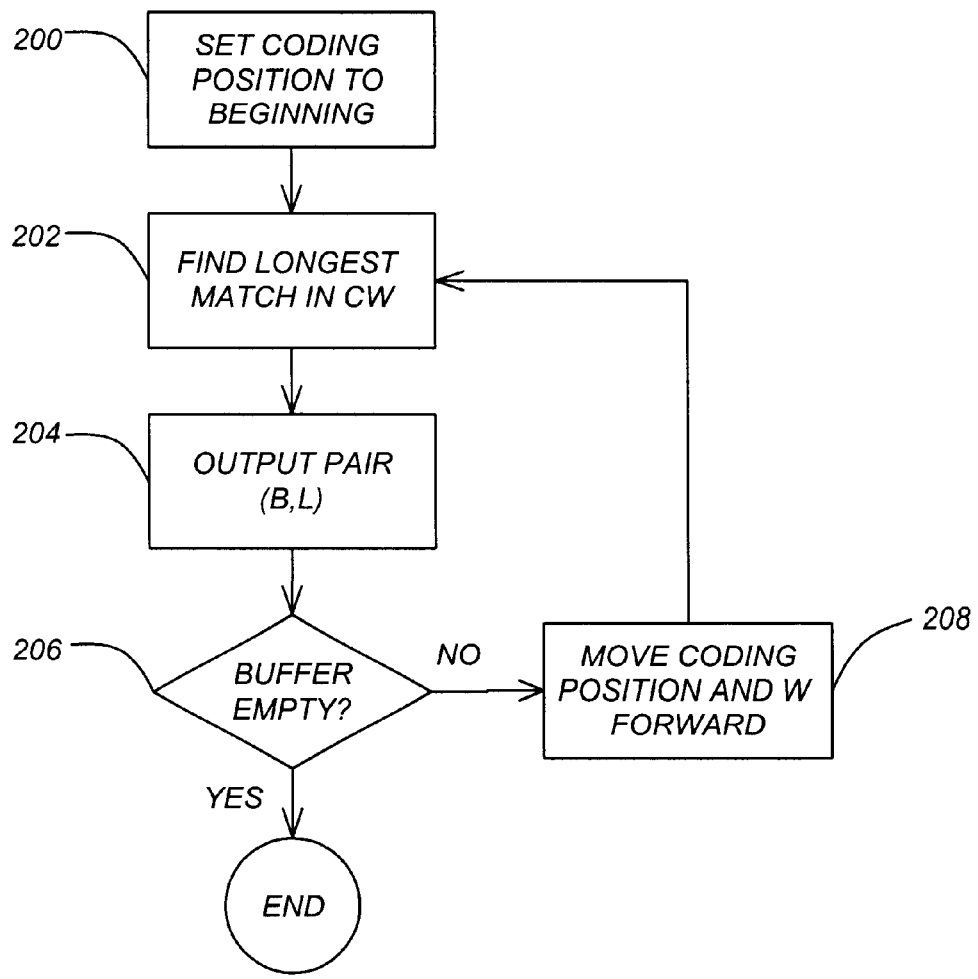
FIG. 2 is a flowchart that illustrates the logic of the Le'Z99 encoding method according to the preferred embodiment of the present invention.

FIG. 2 is a flowchart that illustrates the logic of encoding in the Le'Z99 method according to the preferred embodiment of the present invention.

Block 200 represents the encode and decode program 112 setting the coding position to the beginning of the input data 112.

Block 202 represents the encode and decode program 112 finding a match in the coding window CW for the lookahead buffer, wherein the coding window CW comprises a concatenation of a backward window W and an alphabet window A Block 204 represents the encode and decode program 112 outputting the pair (B,L) as the output data 114 with the following meaning: (1) B is the pointer to the match in the coding window CW and (2) L is the number of characters matched.

Block 206 is a decision block that represents the encode and decode program 112 determining whether the lookahead buffer is empty. If not, control transfers to Block 208; otherwise, the logic terminates.

Block 208 represents the encode and decode program 112 moving the coding position (and the backward window W) L characters forward. Thereafter, control returns to Block 202.

LOGIC OF THE Le'Z99 DECODING METHOD

Figure 3:
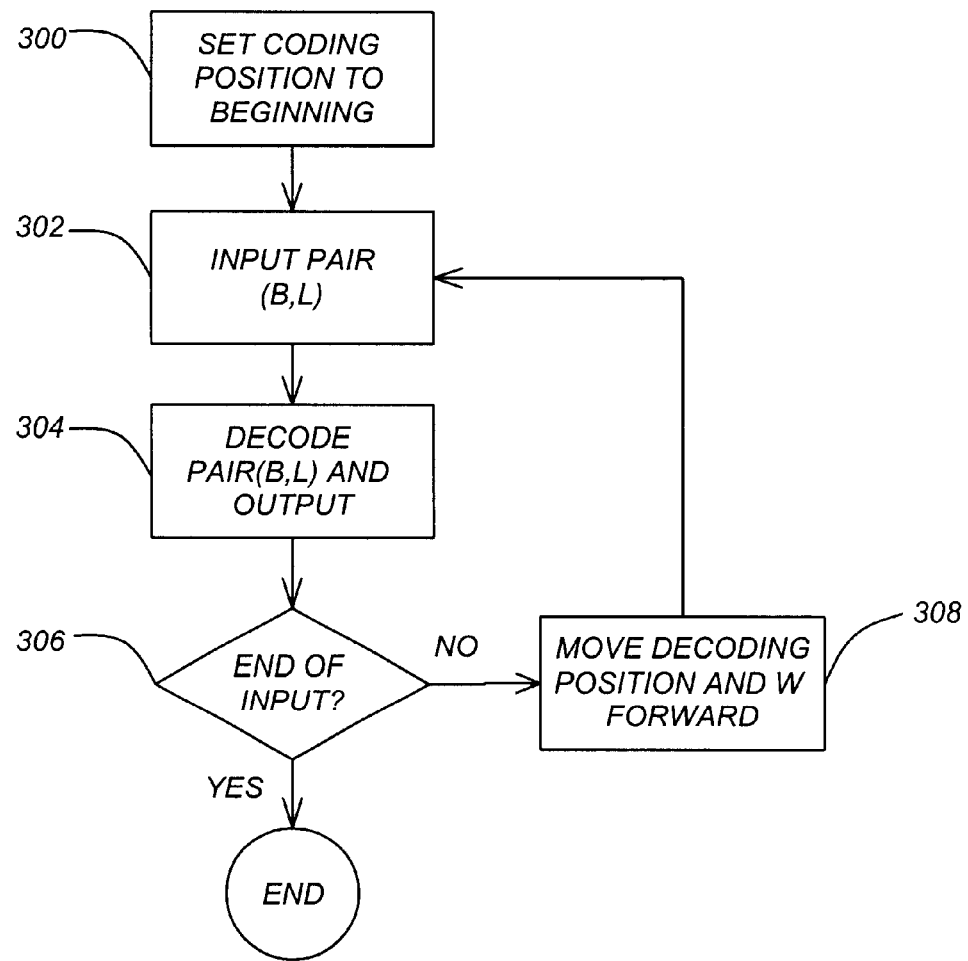
FIG. 3 is a flowchart that illustrates the logic of the Le'Z99 decoding method according to the preferred embodiment of the present invention.

FIG. 3 is a flowchart that illustrates the logic of decoding in the Le'Z99 method according to the preferred embodiment of the present invention.

Block 300 represents the encode and decode program 112 setting the decoding position to the beginning of the input data 112.

Block 302 represents the encode and decode program 112 inputting the pair (B,L) with the following meaning: (1) B is the pointer to the match in the coding window CW and (2) L is the number of characters matched.

Block 304 represents the encode and decode program 112 decoding the pair (B,L) using the coding window CW to generate a character sequence as the output data 114. The pair (B,L) indicates that the encode and decode program 112 should position B characters in the coding window CW and copy an L character sequence to the output data 114.

Block 306 is a decision block that represents the encode and decode program 112 determining whether the end of the input data 112 has been reached. If not, control transfers to Block 308; otherwise, the logic terminates.

Block 308 represents the encode and decode program 112 moving the decoding position to the next (B,L) pair in the input data 112 and moving the backward window W forward to encompass the generated character sequence. Thereafter, control returns to Block 302.

CONCLUSION

This concludes the description of the preferred embodiment of the invention. The following describes some alternative embodiments for accomplishing the present invention. For example, any type of device, such as a computer, integrated circuit, or other electronic device could be used to implement the present invention. Moreover, any software program performing compression and/or decompression could benefit from the present invention.

In summary, the present invention discloses a method, apparatus, and article of manufacture for compressing and decompressing data using an embedded alphabet to reduce code space in the compressed data.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description.

What is claimed is:

1. A method for compressing data, comprising.
   (i) setting an encoding position to a beginning of an input data stream;
   (ii) finding a match in a coding window CW for a lookahead buffer, wherein the coding window CW is comprised of a concatenation of a backward window W that contains W characters from the encoding position and an alphabet window that contains symbols in an alphabet, and the lookahead buffer comprises a character sequence from the encoding position to an end of the input data stream;
   (iii) outputting a pair (B,L), wherein B is a pointer to the match in the coding window CW and L represents a number of characters in the match;
   (iv) if the lookahead buffer is not empty, then moving the encoding position and the backward window W forward L characters in the input data stream and repeating steps (ii)–(iv); and
   (v) if the lookahead buffer is empty, then terminating the method.

2. A method for decompressing data, comprising.
   (i) setting a decoding position to a beginning of an input data stream;
   (ii) inputting a pair (B,L), wherein B is a pointer to a match in a coding window CW comprising a concatenation of a backward window W that contains W characters generated thus far in an output data stream and an alphabet window that contains symbols in an alphabet, and L represents a number of characters in the match;
   (iii) decoding the inputted pair (B,L) using the coding window CW to generate a character sequence for the output data stream, wherein inputted pair (B,L) indicates that L characters from a position B characters in the coding window CW are copied to the output data stream;
   (iv) if the decoding position is not at an end of the input data stream, then moving the decoding position one pair (B,L) forward in the input data stream, moving the backward window W forward to encompass the generated character sequence, and repeating steps (ii)–(iv); and
   (v) if the decoding position is at an end of the input data stream, then terminating the method.

3. An apparatus for compressing data, comprising.
   (i) means for setting an encoding position to a beginning of an input data stream;
   (ii) means for finding a match in a coding window CW for a lookahead buffer, wherein the coding window CW is comprised of a concatenation of a backward window W that contains W characters from the encoding position and an alphabet window that contains symbols in an alphabet, and the lookahead buffer comprises a character sequence from the encoding position to an end of the input data stream;
   (iii) means for outputting a pair (B,L), wherein B is a pointer to the match in the coding window CW and L, represents a number of characters in the match;
   (iv) means for moving the encoding position and the backward window W forward L characters in the input data stream, if the lookahead buffer is not empty, and means for repeating the means (ii)–(iv); and
   (v) means for terminating, if the lookahead buffer is empty.

4. An apparatus for decompressing data, comprising:
   (i) means for setting a decoding position to a beginning of an input data stream;
   (ii) means for inputting a pair (B,L), wherein B is a pointer to a match in a coding window CW comprising a concatenation of a backward window W that contains W characters generated thus far in an output data stream and an alphabet window that contains symbols in an alphabet, and L represents a number of characters in the match;
   (iii) means for decoding the inputted pair (B,L) using the coding window CW to generate a character sequence for the output data stream, wherein inputted pair (B,L) indicates that L characters from a position B characters in the coding window CW are copied to the output data stream;
   (iv) means for moving the decoding position one pair (B,L) forward in the input data stream, moving the backward window W forward to encompass the generated character sequence, if the decoding position is not at an end of the input data stream, and for repeating the means (ii)–(iv); and
   (v) means for terminating, if the decoding position is at an end of the input data stream.

5. An article of manufacture embodying logic for compressing data, the logic comprising.
   (i) setting an encoding position to a beginning of an input data stream;
   (ii) finding a match in a coding window CW for a lookahead buffer, wherein the coding window CW is comprised of a concatenation of a backward window W that contains W characters from the encoding position and an alphabet window that contains symbols in an alphabet, and the lookahead buffer comprises a character sequence from the encoding position to an end of the input data stream;
   (iii) outputting a pair (B,L), wherein B is a pointer to the match in the coding window CW and L represents a number of characters in the match;
   (iv) if the lookahead buffer is not empty, then moving the encoding position and the backward window W forward L characters in the input data stream and repeating steps (ii)–(iv); and
   (v) if the lookahead buffer is empty, then terminating the method.

6. An article of manufacture embodying logic for decompressing data, the logic comprising.
   (i) setting a decoding position to a beginning of an input data stream;
   (ii) inputting a pair (B,L), wherein B is a pointer to a match in a coding window CW comprising a concatenation of a backward window W that contains W characters generated thus far in an output data stream and an alphabet window that contains symbols in an alphabet, and L represents a number of characters in the match;
   (iii) decoding the inputted pair (B,L) using the coding window CW to generate a character sequence for the output data stream, wherein inputted pair (B,L) indicates that L characters from a position B characters in the coding window CW are copied to the output data stream;
   (iv) if the decoding position is not at an end of the input data stream, then moving the decoding position one pair (B,L) forward in the input data stream, moving the backward window W forward to encompass the generated character sequence, and repeating steps (ii)–(iv); and
   (v) if the decoding position is at an end of the input data stream, then terminating the method.

* * * * *